United States Patent
Fujisaki

(10) Patent No.: US 7,337,381 B2
(45) Date of Patent: Feb. 26, 2008

(54) MEMORY TESTER HAVING DEFECT ANALYSIS MEMORY WITH TWO STORAGE SECTIONS

(75) Inventor: Kenichi Fujisaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 99 days.

(21) Appl. No.: 11/243,893

(22) Filed: Oct. 5, 2005

(65) Prior Publication Data

US 2006/0026482 A1 Feb. 2, 2006

Related U.S. Application Data

(63) Continuation of application No. PCT/JP2004/004006, filed on Mar. 24, 2004.

(30) Foreign Application Priority Data

Apr. 16, 2003 (JP) ............... 2003-112124

(51) Int. Cl.
*G01R 31/28* (2006.01)
*G11C 29/00* (2006.01)

(52) U.S. Cl. .............. 714/738; 714/736; 714/723

(58) Field of Classification Search .............. None
See application file for complete search history.

(56) References Cited

U.S. PATENT DOCUMENTS 5,396,504 A * 3/1995 Pack ................. 714/755

FOREIGN PATENT DOCUMENTS

| EP | 437218 A2 * | 7/1991 |
|---|---|---|
| JP | 5-157769 | 6/1993 |
| JP | 9-43315 | 2/1997 |
| JP | 10-83696 | 3/1998 |

OTHER PUBLICATIONS

"Delay testing and failure analysis of ECL logic with embedded memories" Welch et al. VLSI Test Symposium, 1991. 'Chip-to-System Test Concerns for the 90's', Digest of Papers Publication Date: Apr. 15-17, 1991On pp. 254-259 INSPEC Accession No. 4024421.*
International Search Report for CPT/JP2004/004006 mailed on Jul. 13, 2004, 1 page.

* cited by examiner

*Primary Examiner*—Cynthia Britt
(74) *Attorney, Agent, or Firm*—Osha Liang LLP

(57) ABSTRACT

A test apparatus for testing a device-under-test includes: a pattern generator configured to generate an address signal, a test signal, and an expected value signal; a logical comparator configured to compare an output signal outputted from the device-under-test with the expected value signal. The logical comparator generates a fail signal when the output signal is different from the expected value signal; and a failure analysis memory configured to receive the address signal from the pattern generator and to receive the fail signal from the logical comparator. The failure analysis memory includes: a first storage section configured to store a fail address value that corresponds to the fail signal and a fail data value included in the fail signal as a set of data; and a second storage section configured to read the set of data from the first storage section and to store the fail data value.

6 Claims, 5 Drawing Sheets

MEMORY TESTER HAVING DEFECT ANALYSIS MEMORY WITH TWO STORAGE SECTIONS

The present application is a continuation application of PCT/JP2004/004006 filed on Mar. 24, 2004, which claims priority from a Japanese Patent Application No. 2003-112124 filed on Apr. 16, 2003, the content of which is incorporated herein by reference.

BACKGROUND OF THE INVENTION

1. Technological Field

The present invention relates to a test apparatus. More particularly, the invention relates to a test apparatus for testing a device-under-test.

2. Background Art

A memory test apparatus applies and writes an address signal and a test signal generated by a pattern generator to a memory-under-test. It then compares the test signal read out of the memory-under-test with an expected value signal generated by the pattern generator corresponding to the test apparatus and stores the comparison result to a failure analysis memory. After that, the memory test apparatus analyzes the comparison result stored in the failure analysis memory to judge if the memory-under-test is failure-free.

With the recent increase of speed of operating frequency of MPU, operating speed of a memory-under-test such as DRAM is also increasing. However, the failure analysis memory used in the conventional memory test apparatus is composed of SRAMs whose improvement in terms of memory capacity is slow as compared to the DRAM. Therefore, the failure analysis memory having the equal operating speed and memory capacity with those of the memory-under-test is realized by composing the failure analysis memory by a plurality of SRAMs so as to operate through interleave operation.

However, the operating speed of the memory-under-test such as DRAM is increasing continuously even now and it requires a very large number of SRAMs in order to realize the equal operating speed with that of the memory-under-test through the interleave operation of the plurality of SRAMs.

For example, if a test of a memory-under-test having 125 MHz of operating frequency has been realized through the interleave operation of four ways by using four SRAMs, 32 SRAMs must be used and interleave operation of 32 ways must be carried out in order to realize a test of a memory-under-test having 1 GHz of operating frequency.

Still more, because a memory capacity of one SRAM is 1/16 to 1/8 of a memory capacity of one DRAM in general, at least 256 SRAMs are necessary in order to realize the test of the memory-under-test having 1 GHz of operating frequency.

Still more, it is a common practice to reduce a testing cost by simultaneously carrying out the tests of a plural number of memory-under-test by the memory test apparatus and simultaneous testing of 128 memories-under-test is being widely carried out. Accordingly, if 256 SRAMs are necessary for testing one memory-under-test, 32,768 SRAMs are necessary to test 128 memories-under-test in the same time. Therefore, there has been a problem that the memory test apparatus becomes a very large and expensive apparatus just by the failure analysis memory and its peripheral circuits.

SUMMARY OF THE INVENTION

Accordingly, it is an object of the invention to provide a test apparatus capable of solving the above-mentioned problem. This object may be achieved through the combination of features described in independent claims of the invention. Dependent claims thereof specify preferable embodiments of the invention.

One or more embodiments of the present invention are directed to a test apparatus for testing a device-under-test including: a pattern generator configured to generate an address signal, a test signal that is inputted to the device-under-test, and an expected value signal that is expected to be output from the device-under-test when the test signal is inputted to the device-under-test; a logical comparator configured to compare an output signal, which is outputted from the device-under-test responsive to the test signal, with the expected value signal from the pattern generator, wherein the logical comparator generates a fail signal when the output signal is different from the expected value signal; and a failure analysis memory configured to receive the address signal from the pattern generator and to receive the fail signal from the logical comparator. The failure analysis memory includes: a first storage section configured to store a fail address value, which corresponds to the fail signal, and a fail data value included in the fail signal as a set of data; and a second storage section configured to read the set of data from the first storage section and to store the fail data value.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
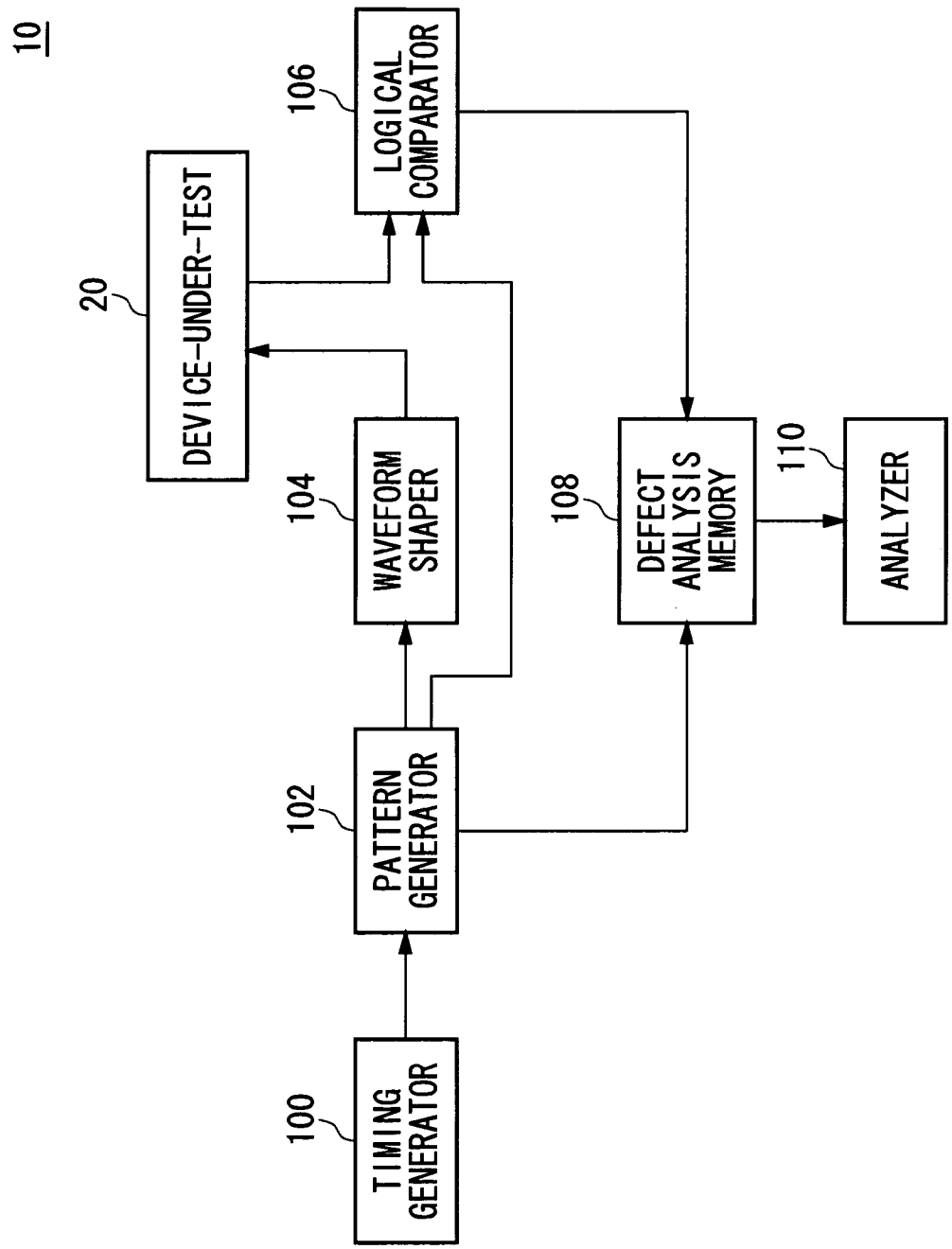
FIG. 1 shows one exemplary structure of a test apparatus 10.

FIG. 1 shows one exemplary structure of a test apparatus 10 according to one embodiment of the invention. The test apparatus 10 has a timing generator 100, a pattern generator 102, a waveform shaper 104, a logical comparator 106, a failure analysis memory 108 and an analyzer 110. The test apparatus 10 carries out a test by applying a test signal to a device-under-test 20. The device-under-test 20 is a memory to be tested such as a DRAM for example.

The pattern generator 102 generates an address signal as well as a test signal containing a data signal and a control signal to be fed to the device-under-test 20 corresponding to reference clock generated by the timing generator 100. The pattern generator 102 also generates an expected value signal to be outputted from the device-under-test 20, to which the test signal has been fed, in correspondence to the test signal fed thereto. While the pattern generator 102 feeds the address signal and the test signal to the waveform shaper 104, it also feeds the address signal to the failure analysis memory 108 and the expected value signal to the logical comparator 106. The waveform shaper 104 shapes the address signal and the test signal received from the pattern generator 102 and feeds them to the device-under-test 20.

The logical comparator 106 compares an output signal outputted from the device-under-test 20 corresponding to the test signal fed from the waveform shaper 104 and the expected value signal received from the pattern generator 102 to judge if the device-under-test 20 is failure-free. Then, the logical comparator 106 generates a fail signal when the output signal outputted from the device-under-test 20 does not coincide with the expected value signal received from the pattern generator 102. The logical comparator 106 feeds the fail signal to the failure analysis memory 108. Receiving the address signal from the pattern generator 102, the failure analysis memory 108 stores the fail signal generated by the logical comparator 106 in an address area specified by the address signal.

The analyzer 110 is a workstation for example and reads the fail signal stored in the failure analysis memory 108 after ending the test of the device-under-test 20 to identify a failure memory cell, to find a distribution of failure memory cells and to analyze a cause of the failure. Then, it feeds back the analyzed result to a memory manufacturing process to improve the yield.

Figure 2:
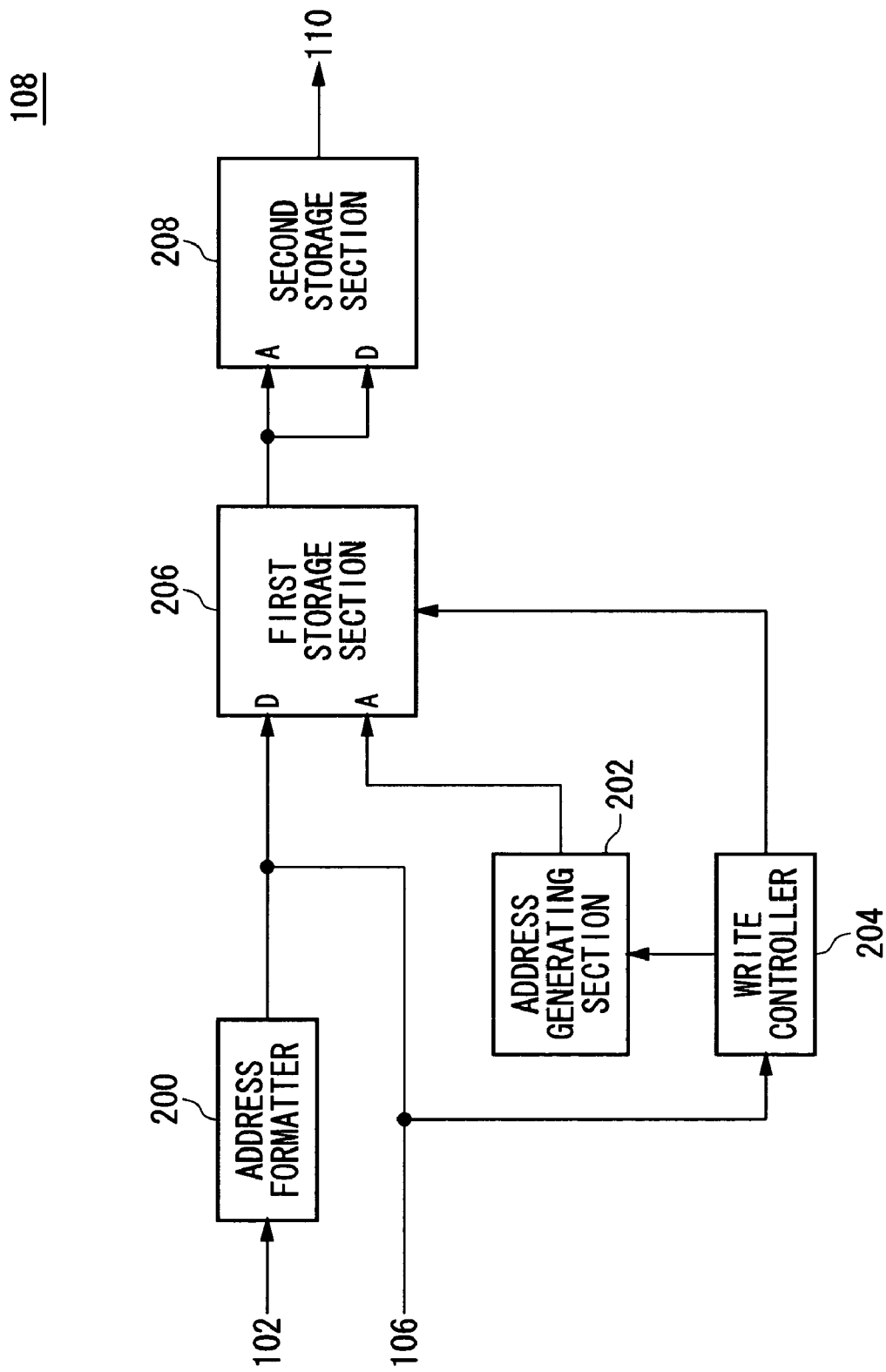
FIG. 2 shows a first exemplary structure of a failure analysis memory.

FIG. 2 shows a first exemplary structure of the failure analysis memory 108 of the present embodiment. The failure analysis memory 108 of the present embodiment has an address formatter 200, an address generating section 202, a write controller 204, a first storage section 206 and a second storage section 208.

The address formatter 200 receives the address signal from the pattern generator 102 and feeds it to the first storage section 206. The address signal contains row and column addresses. When the write controller 204 receives the fail signal from the logical comparator 106, it outputs an INC command to the address generating section 202 and a write command to the first storage section 206. The address generating section 202 feeds the address to the first storage section 206 while incrementing the address in accordance to the INC command from the write controller 204.

The first storage section 206 is a memory for holding the fail signal temporally during the test of the device-under-test 20 and stores a fail address value which is a value of the address signal generated by the pattern generator 102 and a fail data value which is a value of the fail signal generated by the logical comparator 106 sequentially in different address areas as one set of data based on the address generated by the address generating section 202. Operating speed of the first storage section 206, e.g., speed for storing data, is preferable to be equal with operating speed of the device-under-test 20, e.g., its speed for storing data. A memory capacity of the first storage section 206 may be smaller than a memory capacity of the device-under-test 20.

The second storage section 208 is a memory such as SRAM for reading out and holding the fail signal from the first storage section 206 after testing the device-under-test 20. It reads the set of the fail address value and fail data value out of the first storage section 206 and stores the fail data value in an address area specified by the fail address value. In concrete, the second storage section 208 reads out data held in the address area specified by the fail address value read out of the first storage section 206 and stores OR of the data and the fail data value read out of the first storage section 206 in the address area specified by the fail address value read out of the first storage section 206. That is, the second storage section 208 writes the fail data value through read-modify-write operations.

Operating speed of the second storage section 208 may be slower than the operating speed of the device-under-test 20. Still more, the operating speed of the second storage section 208 may be slower than the operating speed of the first storage section 206. A memory capacity of the second storage section 208 is preferable to be larger than the memory capacity of the first storage section 206 and to be equal with the memory capacity of the device-under-test 20.

The test apparatus 10 may be operated efficiently by thus configuring the failure analysis memory 108 by the first storage section 206 for sequentially storing the fail address values and fail data values following the tests and the second storage section 208 for storing the fail data values by reading out of the first storage section 206 after ending the test. That is, in parallel with the operation of the first storage section 206 that sequentially stores the fail data values, the second storage section 208 may be initialized. Still more, in parallel with the operation of the first storage section 206 that sequentially stores the fail data values, the analyzer 110 can read the fail data values out of the second storage section 208 and analyze them. Further, because the second storage section 208 stores the fail data values in the same condition with the conventional failure analysis memory, the analyzer 110 can analyze the device-under-test 20 by using the same software and others with the conventional ones.

Figure 3:
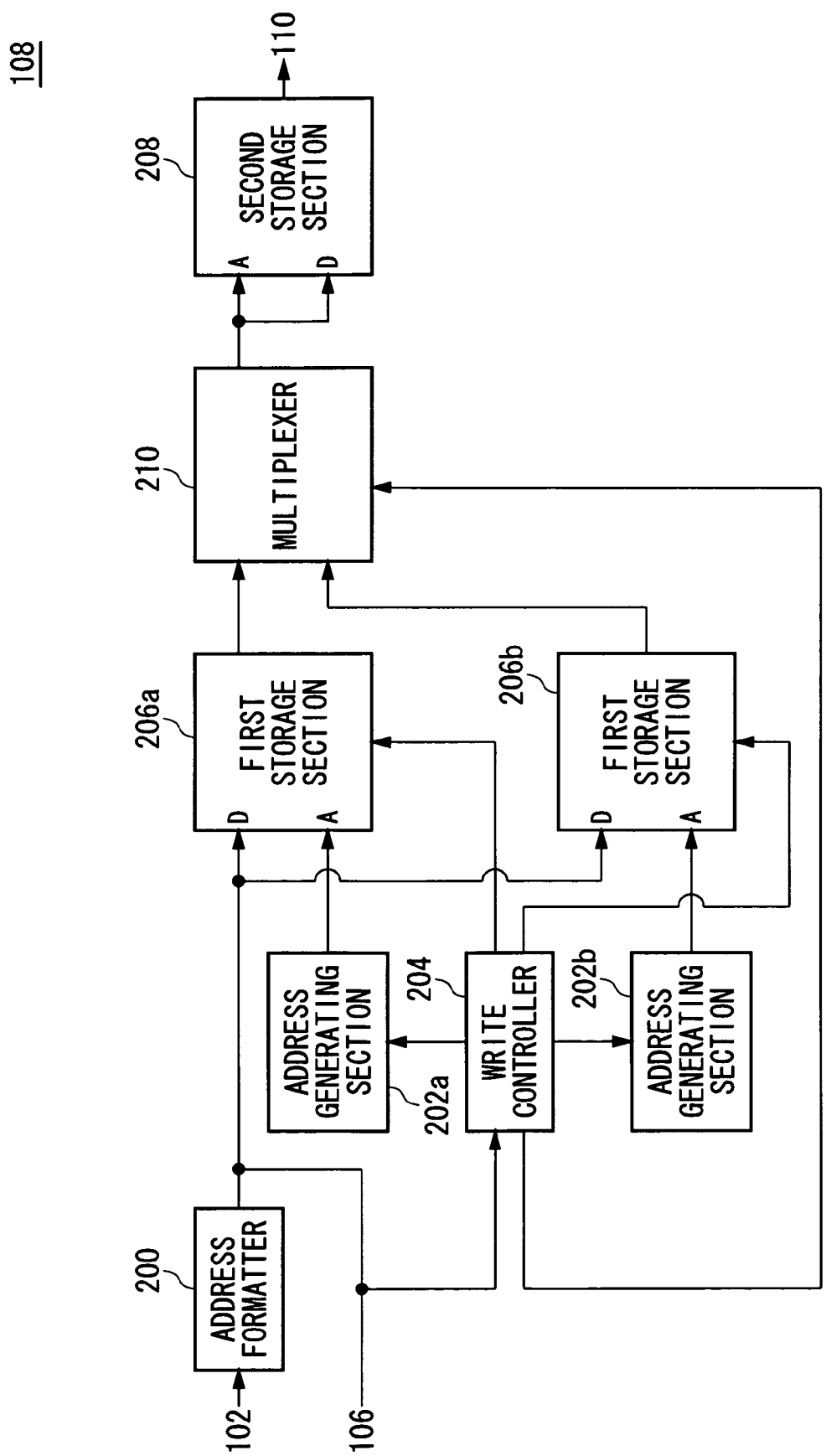
FIG. 3 shows a second exemplary structure of the failure analysis memory.

FIG. 3 shows a second exemplary structure of the failure analysis memory 108 of the embodiment. The failure analysis memory of this example has the address formatter 200, a plurality of address generating sections 202a and 202b, the write controller 204, a plurality of first storage sections 206a and 206b, the second storage section 208 and the multiplexer 210. The structure and operation of the failure analysis memory 108 of this example are the same with the structure and operation of the failure analysis memory 108 in the first example shown in FIG. 2 except of those explained below, so that their explanation will be partly omitted. It is noted that the address generating sections 202a and 202b have the same function with the address generating section 202 and the first storage sections 206a and 206b have the same function with the first storage section 206.

The address formatter 200 receives the address signal from the patter generator 102 and feeds it to the first storage sections 206a and 206b. When the write controller 104 receives the fail signal from the logical comparator 106, it outputs an INC command to the address generating sections 202a and 202b, a write command to the first storage section 206a or 206b and a select command to the multiplexer 210. In accordance to the INC command from the write controller 204, the address generating section 202a counts and outputs addresses to be fed to the first storage section 206a. In accordance to the INC command from the write controller 204, the address generating section 202b also counts and outputs addresses to be fed to the first storage section 206a.

The plurality of first storage sections 206a and 206b store the fail address values and fail data values sequentially in different address areas based on the addresses generated by the address generating sections 202a or 202b as sets of data through the interleave operation. In concrete, the plurality of first storage sections 206a and 206b store the fail address values and fail data values sequentially based on the control of the write controller 204. In accordance to the select command of the write controller 204, the multiplexer 210 reads the set of the fail address value and fail data value from the first storage section 206a or 206b and feeds it to the second storage section 208.

In another example, the first storage section 206a holds the fail address values and fail data values sequentially at first. Then, when a remaining memory amount of the first storage section 206 falls below a predetermined level, the write controller 204 controls the first storage section 206b so that it holds the fail address values and fail data values instead of the first storage section 206a and then the first storage section 206b sequentially holds the fail address values and fail data values. The second storage section 208 may read the data out of the first storage section 206a and store them during when the write operation is shifted from the first storage section 206a to the first storage section 206b and the first storage section 206b stores the fail address values and fail data values. It enables one to reduce a time required for storing data from the first storage sections 206a and 206 to the second storage section 208 after ending the test of the device-under-test 20.

Figure 4:
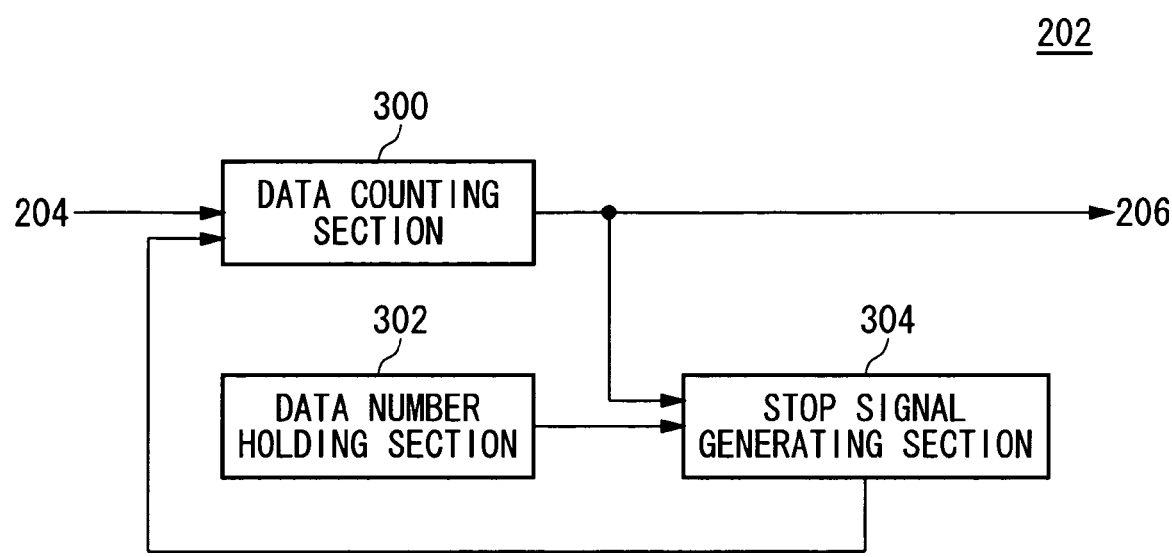
FIG. 4 shows a first exemplary structure of an address generating section 202.

FIG. 4 shows a first exemplary structure of the address generating section 202 of the embodiment. The address generating section 202 of this example has a data counting section 300, a data number holding section 302 and a stop signal generating section 304. The data counting section 300 specifies addresses in the first storage section 206 to write the fail data values in the first storage section 206 while counting a number of stored values which is a number of the fail data values stored in the first storage section 206. Then, after ending the test of the device-under-test 20, the data number holding section 302 receives and holds the stored number counted by the data counting section 300 during the test of the device-under-test 20.

Next, after being initialized, the data counting section 300 specifies the addresses in the first storage section 206 to cause the first storage section 206 to output the fail data values while counting a number of fail data values read by and stored in the second storage section 208 when the second storage section 208 reads and holds the fail data values held by the first storage section 206. The stop signal generating section 304 compares the stored number held by the data number holding section 300 with a number of read values being counted by the data counting section 300. Then, when the stored number coincides with the read number, the stop signal generating section 304 generates a stop signal for stopping the process of the second storage section 208 for reading the fail data value from the first storage section 206 and feeds it to the data counting section 300.

Receiving the stop signal generated by the stop signal generating section 304, the data counting section 300 stops counting of the read number, i.e., counting of addresses in the first storage section 206. It then stops the operation of the second storage section 208 of reading the fail data values from the first storage section 206. Accordingly, the second storage section 208 can read and write only the fail data values stored in the first storage section 206 and can omit extra reading and writing operations, reducing the time required for storing data from the first storage sections 206a and 206 to the second storage section 208.

Still more, in another example, the data number holding section 302 may hold a requisite storage number that is a number of fail data values to be stored in the first storage section 206. Then, the data counting section 300 specifies addresses in the first storage section 206 to write the fail data values in the first storage section 206 while counting the stored number of the fail data values stored in the first storage section 206. The stop signal generating section 304 compares the requisite storage number held by the data number holding section 300 with the stored number counted by the data counting section 300. Then, when the requisite storage number coincides with the stored number, the stop signal generating section 304 generates the stop signal for stopping the process of the first storage section 206 for writing the fail data value and feeds it to the data counting section 300. Receiving the stop signal generated by the stop signal generating section 304, the data counting section 300 stops counting of the stored number, i.e., counting of addresses, with respect to the first storage section 206. It stops the operation of the first storage section 206 for writing the fail data value.

The test of the device-under-test 20 is carried out in a state in which the data number holding section 302 holds the requisite storage number which is larger than a storable number which is a number of fail data values that can be stored in the first storage section 206. Thereby, after storing the fail data values of the storable number, the first storage section 206 stores the fail data values obtained after exceeding the storable number by overwriting the fail data values obtained and stored before exceeding the storable number. Then, after ending the test of the device-under-test 20, the second storage section 208 reads and stores the fail data values stored in the first storage section 206.

Here, because the overwritten fail data values are stored in the first storage section 206, the second storage section 208 is unable to obtain the part of the fail data values stored in the first storage section 206 before overwriting. Then, the test of the device-under-test 20 is carried out again in a state in which the data number holding section 302 holds a number below the storable number and above the number of the overwritten fail data values as a requisite possible number. Thereby, the first storage section 206 stores fail data values of the requisite storage number further. Then, after ending the test of the device-under-test 20 again, the second storage section 208 reads and stores the fail data values stored in the first storage section 206 further. Such method enables one to easily obtain data more than that of the fail data values that can be stored in the first storage section 206.

Figure 5:
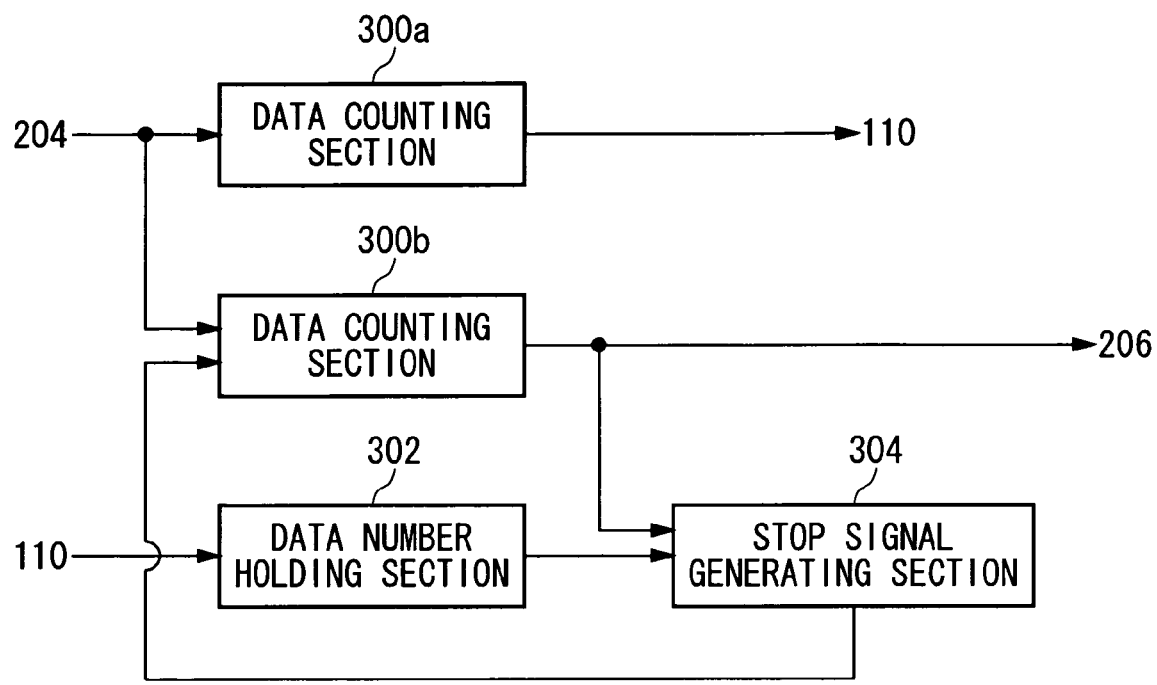
FIG. 5 shows a second exemplary structure of the address generating section 202.

FIG. 5 shows a second exemplary structure of the address generating section 202 of the embodiment. The address generating section 202 of this example has data counting sections 300a and 300b, the data number holding section 302 and the stop signal generating section 304.

The data counting section 300a counts a generated number which is a number of fail data values generated in the test of the device-under-test 20 and feeds it to the analyzer 110. The analyzer 110 is an example of a test number calculating section of the invention and calculates a number of times of test of the device-under-test 20 necessary to store all of the fail data values generated in the test of the device-under-test 20 in the second storage section 208 by dividing the generated number counted by the data counting section 300a by the storable number which is the number of the fail data values storable in the first storage section 206.

The test of the device-under-test 20 is carried out in a state in which the data number holding section 302 holds the storable number that is the number of the fail data values storable in the first storage section 206 as a requisite storage number. The data counting section 300b specifies the addresses in the first storage section 206 to write the fail data values in the first storage section 206 while counting the stored number of the fail data values stored in the first storage section 206. The stop signal generating section 304 compares the requisite storage number held by the data number holding section 302 with the stored number counted by the data counting section 300b. Then, when the requisite storage number coincides with the stored number, the stop signal generating section 304 outputs a stop signal for stopping the process of the first storage section 206 for writing the fail data value and feeds it to the data counting section 300b. Receiving the stop signal generated by the stop signal generating section 304, the data counting section 300b stops counting of the stored number, i.e., counting of addresses in the first storage section 206. It stops the first storage section 206 from writing the fail data value. Through the operations described above, the first storage section 206 stores the fail data values of storable number. Then, after ending the test of the device-under-test 20, the second storage section 208 reads out and stores the fail data values of the storable number stored in the first storage section 206.

Next, the test of the device-under-test 20 is carried out in a state in which the data number holding section 302 holds a double of the storable number which is the number of fail data values storable in the first storage section 206 as a requisite storage number. Thereby, after storing the fail data values of the storable number, the first storage section 206 overwrites and stores the fail data values of the storable number further. Then, after ending the test of the device-under-test 20, the second storage section 208 reads and stores the fail data values of the storable number stored in the first storage section 206.

After that, the second storage section 208 repeatedly reads and stores the fail data values stored in the second storage section 208 by each storable number while repeatedly carrying out the test of the device-under-test 20 until reaching to a number obtained by multiplying the storable number with the number of times of tests calculated by the analyzer 110 by increasing the requisite storage number held by the data number holding section 302 by each storable number. Then, the second storage section 208 stores all of the fail data values generated in the test of the device-under-test 20. Such method enables one to obtain all of the fail data values generated in the test of the device-under-test 20 even if the fail data values that can be stored in the first storage section 206 is small.

Although the second storage section 208 repeatedly reads and stores the fail data values stored in the first storage section 206 by each storable number while repeatedly carrying out the test of the device-under-test 20 by increasing the requisite storage number held by the data number holding section 302 by each storable number in this example, the second storage section 208 may repeatedly read and store the fail data values stored in the first storage section 206 by each storable number while repeatedly carrying out the test of the device-under-test 20 by increasing the requisite storage number held by the data number holding section 302 by each number smaller than the storable number in another example. Still more, the second storage section 208 may repeatedly read and store the fail data values stored in the first storage section 206 by each storable number while repeatedly carrying out the test of the device-under-test 20 by increasing the requisite storage number held by the data number holding section 302 while changing the number to be increased.

According to the test apparatus 10 of the present embodiment, because the first storage section 206 stores the fail address values and fail data values sequentially as a set of data and the memory capacity may be effectively and actively used, the number of the first storage sections 206 may be reduced. Still more, because the set of the fail address values and fail data values stored in the first storage section 206 is developed in the second storage section 208 and the fail data values are stored in the same condition with the conventional failure analysis memory, the analyzer 110 can analyze the device-under-test 20 by using the same software and others with the conventional ones.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

As it is apparent from the above description, the invention is capable of providing the test apparatus that can realize the test of the device-under-test 20 whose operating speed is high in a small scale and at low cost.

What is claimed is:

1. A test apparatus for testing a device-under-test, comprising:
a pattern generator configured to generate an address signal, a test signal that is inputted to the device-under-test, and an expected value signal that is expected to be output from the device-under-test when the test signal is inputted to the device-under-test;
a logical comparator configured to compare an output signal, which is outputted from the device-under-test responsive to the test signal, with the expected value signal from the pattern generator, wherein the logical comparator generates a fail signal when the output signal is different from the expected value signal; and
a failure analysis memory configured to receive the address signal from the pattern generator and to receive the fail signal from the logical comparator, the failure analysis memory comprising:
a first storage section configured to store a fail address value, which corresponds to the fail signal, and a fail data value included in the fail signal as a set of data; and
a second storage section configured to read the set of data from the first storage section and to store the fail data value.

2. The test apparatus of claim 1, wherein the first storage section stores the fail address value and the fail data value at an address based on the fail address value.

3. The test apparatus of claim 1, wherein the second storage section stores the fail data value at an address based on the fail address value.

4. The test apparatus of claim 1, wherein the failure analysis memory comprising a plurality of first storage sections configured to store the fail address value and the fail data value as a set of data through interleave operations.

5. The test apparatus of claim 1, wherein the failure analysis memory further comprising:
a data counting section configured to count a number of the fail data values stored in the first storage section and a number of the fail data values stored in the second storage section;
a data number holding section configured to hold the number of the fail data values and the number of the fail data values counted by the data counting section; and
a stop signal generating section configured to compare the number of the fail data values and the number of the fail data values counted by the data counting section to the number of the fail data values and the number of the fail data values held by the data number holding section,
wherein the stop signal generating section generates a stop signal to stop to read a fail data value from the first storage section when the stop signal generating section determines that the numbers counted by the data counting section are the same as the numbers held by the data number holding section respectively.

6. The test apparatus as set forth in claim 5, wherein the signal generating section compares the numbers after the second storage section is initialized.

* * * * *